United States Patent [19]

Rotman et al.

[11] Patent Number: 5,160,765
[45] Date of Patent: Nov. 3, 1992

[54] PROCESS FOR THE METALLIZATION OF CERAMICS AND APPARATUS FOR CARRYING OUT THE PROCESS

[75] Inventors: Frédéric Rotman, Tokyo, Japan; Yannick Rançon, Velizy, France; Philippe Queille, Viroflay, France; Michel Olivier, Beynes, France

[73] Assignee: L'Air Liquide, Societe Anonyme Pour L'Etude Et L'Exploitation Des Procedes Georges Claude, Paris, France

[21] Appl. No.: 484,322

[22] Filed: Feb. 22, 1990

[30] Foreign Application Priority Data

Feb. 22, 1989 [FR] France ................. 89 02279

[51] Int. Cl.$^5$ ............................................. B05D 3/02
[52] U.S. Cl. .................................... 427/229; 427/377; 427/380
[58] Field of Search ................. 427/229, 377, 380

[56] References Cited

U.S. PATENT DOCUMENTS 4,822,645  4/1989  Oda et al. .............................. 427/377

FOREIGN PATENT DOCUMENTS 0209065  1/1987  European Pat. Off. .

OTHER PUBLICATIONS

Solid State Technology, Apr. 1985, Air Products & Chemicals Inc.; E. A. Hayduk, Jr.: "Effect of Atmosphere Composition on Metallizing A1203 Substrates with Mo-Mn Paste".

American Ceramic Society Bulletin, vol. 66, No. 10, 1987, pp. 1510-1512, ACerS; F. W. Giacobbe: "Advanced Gas Moisturizing System for Ceramic Processing Applications".

Primary Examiner—Janyce Bell
Attorney, Agent, or Firm—Browdy and Neimark

[57] ABSTRACT

Metallization of ceramics of the type comprising depositing a metallic paste based on molybdenum and/or tungsten and manganese on a ceramic substrate and effecting the sintering of the paste in an atmosphere having a predetermiend oxido-reduction potential, with a rise in and a maintenance of a temperature between 1300° C. and 1600° C., then cooling to ambient temperature, with production of an atmosphere by the addition to a pure neutral gas of a quantity of additional oxygen and a quantity of hydrogen at least sufficient to subsequently obtain by catalytic reaction the desired content of water vapour and contingently the excess content of hydrogen.

14 Claims, 1 Drawing Sheet

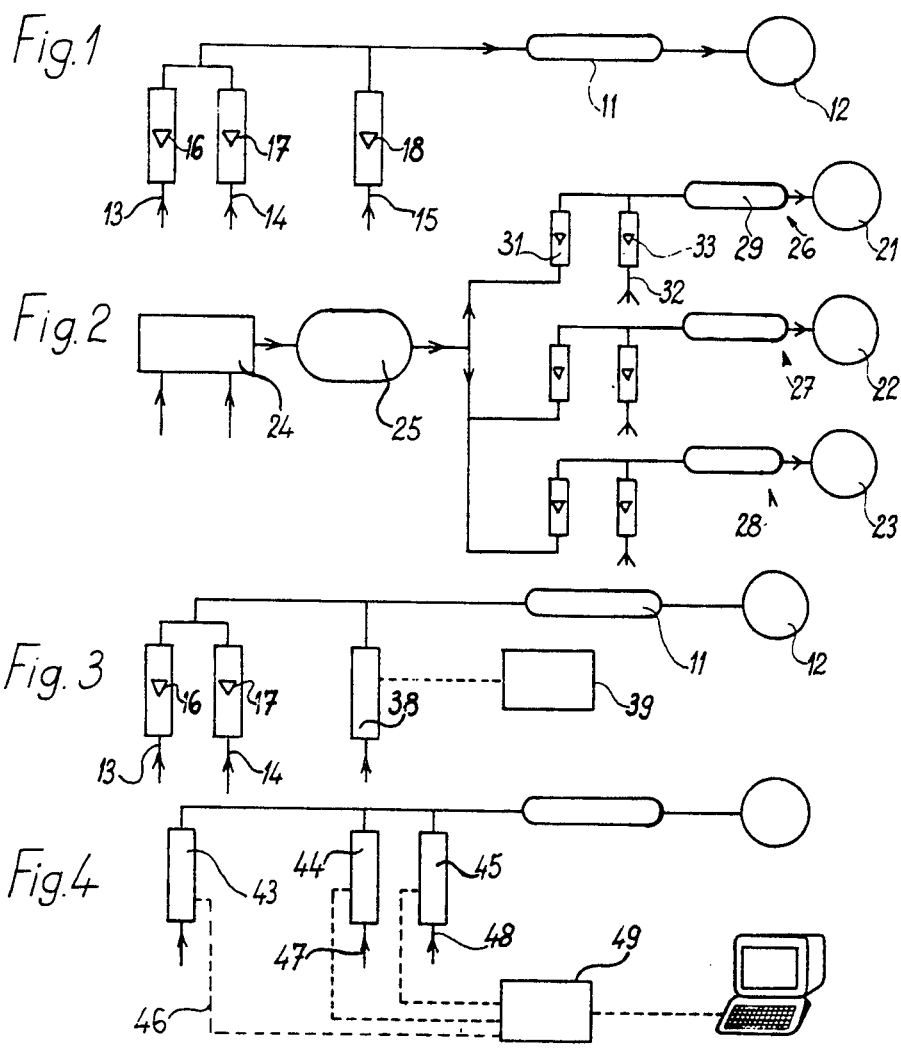

PROCESS FOR THE METALLIZATION OF CERAMICS AND APPARATUS FOR CARRYING OUT THE PROCESS

The present invention relates to the metallization of ceramics of the type comprising depositing a metallic paste based on molybdenum and/or tungsten, and manganese on a ceramic substrate of in particular alumina, and thereafter effecting a sintering of said metallic paste in an atmosphere having a predetermined oxido-reducing potential, with a rise in and a maintenance of temperature of between 1300° C. and 1600° C., then cooling to ambient temperature.

The metallization of ceramics has its principal application in the field of the electrotechnical industry. The metal is employed for its conductive properties, while the ceramic performs the function of a mechanical support, a thermal barrier, or an electrical insulator.

The connection between the ceramic and the metal is achieved by a first step for the metallization of the ceramic followed by a step for the nickelling and lastly a brazing of the useful metal on this metallized and nickelled ceramic.

The metallization of the ceramic comprises a sintering at high temperature of a paste based on molybdenum and/or tungsten and manganese. The object is to eliminate the organic binders which impart to the paste its rheology then oxidize the manganese while remaining reducing as concerns the molybdenum and tungsten. This sintering operation is carried out under an atmosphere having a controlled oxidoreduction potential. The most generally employed atmospheres are moist cracked ammonia, moist hydrogen, or a mixture of hydrogen, nitrogen and water vapour. The sintering conditions were studied by M. E. ARTHUR and L. F. FUSSEL in an article entitled "Effect of Sintering conditions on $Al_2O_3$-MoMn bond strengths" which appeared in "Ceramic Bulletin", volume 50, No. 12, 1971.

The treatment atmospheres involved in these metallization operations must have well-determined contents of water vapour since these contents of water vapour intervene both as such and in relation in a ratio with the hydrogen content so as to impart to the gas an oxidizing effect, a reducing effect and a neutral effect.

The moist atmospheres for these metallizations of ceramics are at the present time obtained by a simple bubbling of the gas in a vessel containing water. However, this manner of proceeding presents the drawbacks of imposing a dew point which is roughly equal to the ambient temperature, and fluctuations of the dew point by variation of the ambient temperature and of the water level in the bubbler. In order to obtain dew points higher than the ambient temperature, it is therefore necessary to heat the water of the bubbler and if it is, on the contrary, desired to obtain dew points lower than the ambient temperature, it is necessary to cool the water of the bubbler or dilute the gas saturated with water with a dry gas. Furthermore, in order to obtain a well-fixed dew point it is not only necessary at the present time to regulate the temperature of the water of the bubbler, and therefore to employ thermally-insulated baths provided with thermostats, but also necessary to regulate the level of the water, and therefore to employ a level probe coupled with an automatic filling device. An arrangement of this type has been found costly, and furthermore, notwithstanding all its improvements, various drawbacks still subsist:

on one hand, the value of the dew point produced is a function of the geometry of the bubbler (in particular of the water/gas exchange surface), whence the obligation to determine by calibration the operating conditions of each bubbler (heating and dilution) in order to obtain the desired dew points;

on the other hand, when it is desired to change from a dew point to a higher dew point, this change, obtained by heating the bath, presents the drawback of a long response time;

lastly, in the case where it is desired to change to a lower dew point, the cooling of the bath presents the same drawback of thermal inertia as before, while the dilution presents the drawback of a change in the total flow when changing from one dew point to another.

These drawbacks may of course be avoided by a quasi-infinite extension of the water/gas exchange surface area by passing, for example, through a large volume of porous material as described in the article entitled "Advanced gas Moisturizing System for Ceramic processing applications" by F. W. GIACOBBE, which appeared in "American Ceramic Society Bulletin", Volume 66, No. 10, 1987 and by conservation of the total flow by readjustment of the flows of moisturized gas and dry gas.

However, such a moisturizing system is still hardly flexible. Its construction is very costly and the problem of the thermal inertia when it is desired to change the temperature of the bath is still not solved.

An object of the present invention is to provide equipment having functions of higher performances which is simple, flexible and cheap. Furthermore, the invention satisfies the need for processes requiring atmospheres having dew points which are both controlled and evolutive, especially required in the technique of the metallization of ceramics.

In the process for metallizing ceramics according to the invention, the treatment atmosphere comprises hydrogen and water vapour, optionally an inert gas such as nitrogen, with:

either a ratio of the hydrogen content to the water content whose value is between 9 and 36 throughout the production cycle, and with a water vapour content of between 0.5% and 5%;

or a ratio of the hydrogen content to the water content in the course of the production cycle, with a first stage for eliminating the binders during the rise in temperature up to about 600° C. during which the water vapour content is between 2% and 8% and the ratio of the hydrogen content to the water vapour content is between 5 and 20; then a second stage for oxidizing the manganese upon the rise in temperature between about 600° C. and about 1000° C., during which the water vapour content is between 0.5% and 5% and the ratio of the hydrogen content to the water vapour content is between 7 and 28; then a third sintering stage and cooling up to the end of the cycle during which the water vapour content is lower than 0.1% and the hydrogen content is higher than 7%;

with, furthermore, the creation of either one of said atmospheres by a mixture of hydrogen and a quantity of additional oxygen, optionally a neutral gas such as nitrogen, the hydrogen being in a quantity at least sufficient to subsequently obtain by catalytic reaction the desired content of water vapour and contingently the excess content of hydrogen which correspond to the composition of the required atmosphere.

The applicant is well aware that the intrinsic principle of the production by catalysis of a water vapour content in a gas has already been proposed, in particular in the article entitled "Reduction of Iron Oxide by Pure Hydrogen" by L. GUILLET, M. EUDIER and Ph. POUPEAU which appeared in "Mémoires Scientifiques Revue Métallurgique" No. 7/8 1967 in which it is proposed to employ, in a study of the reduction of iron protoxide, either pure hydrogen or mixtures of hydrogen, water vapour and argon.

However, the applicant has found that, notwithstanding the wide knowledge of the chemical reaction concerned and of the possibility of producing it by a catalytic reaction, no application on an industrial scale in the metallization of ceramics has been proposed up to the present time, notwithstanding the difficulties experienced in obtaining such moist atmospheres according to the aforementioned techniques and notwithstanding the particularly attractive effect of the solution applied according to the invention in the technique in question, where the reproducibility and the precision of the operating conditions of manufacture are primordial, and notwithstanding the advantages of an optimum variation of the water vapour content in the course of the metallization operation.

The catalyst employed in the process according to the invention is so chosen as to permit an immediate and complete reaction of the oxygen at ambient temperature with a residual content of oxygen lower than 10 vpm. A catalyst which may be employed is of the type employing palladium on an alumina support which is capable of treating an hourly flow up to about 5,000 to 10,000 times the volume of the reactor. This type of catalyst usually requires no prior heating of the gas and moreover does not involve a starting up stage of the reactor with an initial rejection of gas to the open air.

According to another variant of carrying out the invention, the additional oxygen is initially present in the nitrogen which is raw nitrogen obtained by separation of air by permeation or adsorption.

The features and advantages of the invention will be apparent from the following description and are given as examples with reference to FIGS. 1 to 4 which diagrammatically represent four embodiments of the invention.

The invention can be better understood by the attached drawings in which:

FIG. 1 is a schematic of the apparatus for passing gasses through a catalytic chamber to a furnace.

FIG. 2 is a schematic of the apparatus with separate oxygen supplies added the gas supply before passing through separate catalytic chambers to separate catalytic chambers to separate furnaces.

FIG. 3 is a schematic of the apparatus where mass flow rate regulators and controls regulate the gas flow.

FIG. 4 is a schematic of the apparatus with all gas supplies having flow regulators and computerized control of the regulators.

FIG. 1 represents a simplified embodiment in which the three gas constituents nitrogen ($N_2$), hydrogen ($H_2$), oxygen ($O_2$) are conducted to a catalytic chamber 11 and thence to a furnace 12 via supply pipes: 13 for the nitrogen, 14 for the hydrogen, 15 for the oxygen, each pipe 13, 14 and 15 incorporating a floater-type flowmeter 16-17-18 equipped with a regulating valve for adjusting the flow. In this way it is possible, by means of a simple regulation of the flows, to employ dew points higher or lower than the ambient temperature.

In FIG. 2 which concerns a common supply for a plurality of furnaces 21, 22, 23, . . . a premixture of nitrogen ($N_2$), hydrogen ($H_2$) is first of all produced in a mixer 24 and then conducted to a plurality of stations of utilization after passage through a common buffer chamber 25. Each distribution line 26, 27, 28 . . . comprises:

a flowmeter 31 for regulating the flow of the mixture of nitrogen ($N_2$) and hydrogen ($H_2$);

a supply pipe 32 having a flowmeter 33 for regulating the flow of oxygen ($O_2$);

a catalytic chamber 29 for producing the water vapour.

In this way a plurality of furnaces in parallel may be supplied and it is possible, for a given mixture $N_2/H_2$, to employ different dew points from one furnace to the other.

In FIG. 3 which is a variant of FIG. 4, where like elements are designated by like reference numerals, a higher stability of the dew point is ensured by obtaining a particularly stable flow of oxygen, which is achieved with an apparatus of the type having a mass flow rate regulator 38 equipped with a control 39.

In FIG. 4, three mass flow rate regulators 43, 44 and 45 are employed in the pipes for the nitrogen 46, hydrogen 47 and oxygen 48, coupled with a computerized control device 49, permitting a dynamic control of the dew point by means of an automatic control of the flows. In this way it is easy to program a dew point profile simultaneously with a thermal profile while conserving a constant total gas flow.

Any combination of these different embodiments may of course be envisaged.

There will now be given hereinafter a few examples of the application of the use of atmospheres to the metallization of ceramics.

FIRST EXAMPLE

In order to metallize alumina by the molybdenum-manganese technique by sintering at 1400° C., the device shown in FIG. 3 is employed.

This version with a mass flow rate regulator concerning the oxygen (precision equal to 1% of the full scale) is recommended in this case, since the content of water vapour of the mixture injected into the furnace is a critical parameter for sintering the metallic powder.

The floater-type flowmeters employed for the nitrogen and hydrogen have a precision equal to 2% of their full scale. The mass flow rate regulator and the floater-type flowmeters are so chosen that the measured flows are situated about halfway in the scale.

The object is to inject into the furnace, throughout the duration of the temperature cycle, 2 cu.m/h of an $N_2$, $H_2$, $H_2O$ atmosphere comprising 25% hydrogen and 1.2% water vapour.

The ratio $H_2/H_2O$ (21) is sufficient to permit an oxidation of the manganese while remaining reducing with respect to the molybdenum.

This atmosphere is obtained from a primary mixture of 1476 l/h of nitrogen and 524 l/h of hydrogen. The composition of the 2000 l/h of this primary mixture is therefore:

$N_2 = 73.8\% \pm 1.5\%$ $H_2 = 26.2\% \pm 1.5\%$

A measurement of the moisture in this mixture reveals a water vapour content of lower than 10 ppm (dew point $< -60°$ C.).

A flow of oxygen of 12 l/h is added to this first mixture. As this flow is measured by a mass flow rate regulator, the precision is $\pm 0.24$ l/h.

In passing into the catalytic chamber, all the oxygen reacts with the excess hydrogen and forms water.

The expected values of the gas flows at the outlet of the catalytic chamber are the following:
1476 l/h of nitrogen
500 l/h of hydrogen
24 l/h of water vapour
namely a total of 2000 l/h.

This result illustrates one of the advantages of the invention: whatever the desired water vapour content, the total flow remains constant (2000 l/h in this case).

Taking into account the uncertainties as concerns the gas flows, the relative calculated proportions of the gas constituents are the following:

$N_2 = 73.8\% \pm 1.6\%$ $H_2 = 25.0\% \pm 1.5\%$ $H_2O = 1.20\% \pm 0.07\%$ $O_2 = 0\%$

A check take-off at the outlet of the catalytic system permits analyzing the gas mixture so as to control the content of the different constituents: the hydrogen content is measured by a chromatograph, the water vapour content by a hygrometer having a cooled mirror, and the oxygen content by an analyzer with an electrolytic cell.

$H_2 = 24.4\% \pm 0.2\%$ $H_2O = 1.15\% \pm 0.02\%$ $O_2 < 5$ ppm

Taking into account the experimental uncertainties, the measured contents are in full conformity to the calculated contents. Consequently, no calibration is necessary.

Furthermore, the use of a mass flow rate regulator for the oxygen permits an easy control of the stability of the dew point.

SECOND EXAMPLE

In order to metallize alumina with the molybdenum-manganese technique, by sintering at 1400° C., the device shown in FIG. 4 is employed.

The object is to produce a dew point which changes as a function of the temperature cycle:

| (a) | from the ambient temperature to 550° C.: | $H_2O = 3\%$<br>$H_2 = 25\%$ |
| --- | --- | --- |
| (b) | from 550° C. to 1000° C.: | $H_2O = 2\%$<br>$H_2 = 25\%$ |
| (c) | from 1000° C. to the end of the cycle, | $H_2O = 0\%$<br>$H_2 = 10\%$ |

The configuration of the apparatus shown in FIG. 4 enables such a sequence to be easily achieved owing to the control of the three mass flow rate regulators by a computer.

Part (a) of the cycle:

The high water vapour content facilitates the elimination of the binders while preventing the oxidation of the manganese. The mass flow rate regulators are so set that there is added to the primary mixture:

$N_2 = 72.0\% \pm 0.8\%$; $H_2O < 10$ ppm $H_2 = 28.0\% \pm 0.8\%$ a current of oxygen equal to $O_2 = 1.50\% \pm 0.03\%$ (in percentage of the flow $N_2 + H_2$)
to obtain after passage through the catalytic chamber the following mixture (calculated proportions):

$N_2 = 72.0\% \pm 0.9\%$ $H_2 = 25.0\% \pm 0.8\%$ $H_2O = 3.0\% \pm 0.12\%$ $O_2 = 0\%$

Now, the proportions measured experimentally are:

$H_2 = 25.5\% \pm 0.2\%$ $H_2O = 2.97\% \pm 0.04\%$ $O_2 < 5$ ppm

Taking into account the experimental uncertainties, the measured contents are in full conformity to the calculated contents.

Part (b) of the cycle:

When the temperature in the furnace reaches 550° C., new flows are set on the mass flow rate regulators. The ratio $H_2/H_2O$ (12.5) is sufficient to permit an oxidation of the manganese while remaining reducing as concerns molybdenum.

There is added to the primary mixture:

$N_2 = 73.0\% \pm 0.8\%$ $H_2 = 27.0\% \pm 0.8\%$ $H_2O < 10$ ppm a current of oxygen $O_2 = 1.0\% \pm 0.02\%$ (as a percentage of the flow $N_2 + H_2$)
so as to obtain, after passage through the catalytic chamber (calculated contents):

$N_2 = 73.0\% \pm 0.9\%$ $H_2 = 25.0\% \pm 0.8\%$ $H_2O = 2.0\% \pm 0.08\%$ $O_2 = 0\%$

Now, the proportions measured experimentally are:

$H_2 = 24.9\% \pm 0.2\%$ $H_2O = 1.91\% \pm 0.03\%$ $O_2 < 5$ ppm

Part (c) of the cycle:

When the temperature in the furnace reaches 1000° C., new flows are set on the mass flow rate regulators.

The oxygen current is brought back to zero, since the step for oxidizing the manganese has terminated.

The proportion of hydrogen is brought back to 10% for reasons of economy. Whence the calculated proportions:

$N_2 = 90\% \pm 0.4\%$ $H_2 = 10\% \pm 0.4\%$ $H_2O = 0\%$ $O_2 = 0\%$ 1 minute after changing from (b) to (c) (T=1009° C.), the measured contents are:

$H_2 = 9.9\% \pm 0.1\%$ $H_2O = 400$ ppm $\pm 20$ ppm (dew point equal to about $-30°$ C.)

$O_2 < 5$ ppm 3 minutes after changing from (b) to (c) (T=1031° C.) the measured contents are:

$H_2 = 9.9\% \pm 0.1\%$ $H_2O < 20$ ppm (dew point $< -55°$ C.)

$O_2 < 5$ ppm

The small residue of water vapour during a few minutes after stopping the oxygen flow corresponds to the purging of the catalytic chamber.

As the residue is extremely small at the end of one minute, the transition is virtually instantaneous.

This example illustrates some of the advantages of the invention:

dynamic control of the dew point very short response time when changing a dew point.

We claim:

1. A process for metallizing ceramic articles which comprises the steps of:
    a) depositing on a ceramic substrate a coating of a metallizing paste;
    b) placing the coated substrate in an oven;
    c) producing a treatment atmosphere comprising nitrogen, hydrogen and water vapor and which is substantially free of oxygen by
        (i) providing a first mixture of nitrogen and hydrogen;
        (ii) introducing oxygen into said first mixture for obtaining a second mixture; and
        (iii) passing the second mixture through a catalytic reactor to cause the oxygen in the second mixture to catalytically react with the hydrogen, said treatment atmosphere having a ratio of hydrogen content to water content of between 5:1 and 36:1;
    d) supplying the oven with said treatment atmosphere; and
    e) raising the temperature in the oven from the room temperature to a temperate between 1300° C. and 1600° C.

2. The process according to claim 1 further comprising the step of selectively monitoring the concentration of at least one component of said treatment atmosphere in the oven.

3. The process according to claim 2 wherein the component being monitored is the water vapor.

4. The process according to claim 1, wherein the content of hydrogen in said treatment atmosphere is kept substantially constant during step e).

5. The process according to claim 1, wherein the ratio of the hydrogen content to the water vapor content in the treatment atmosphere is kept substantially constant during step e).

6. The process according to claim 1, further comprising controlling and modifying the ratio of hydrogen to water vapor in said treatment atmosphere in the oven during step e).

7. The process according to claim 6, where said ratio of $H_2$ to $H_2O$ is between 9:1 and 36:1 during step e).

8. The process according to claim 6, wherein said ratio is substantially increased when the temperature in the oven is greater than 1000° C.

9. The process according to claim 8, wherein said ratio is greater than 70.

10. The process according to claim 6, further comprising the steps of successively adjusting the ratio of hydrogen to water vapor during step e) so that it is:
    between 5 and 20 when the temperature in the oven is lower than 600° C.;
    between 7 and 28 when the temperature in the oven is between 600° and 1000° C.;
    greater than 70 when the temperature in the oven is greater than 1000° C.

11. The process according to claim 1, wherein the catalyst employed permits immediate and complete reaction of the oxygen at ambient temperatures with a residual content of oxygen less than 10 ppm.

12. The process of claim 1, wherein said catalytic reaction is carried out with a palladium-bases catalyst.

13. A process for metallizing ceramic articles which comprises the steps of:
    depositing a coating of a metallizing paste containing molybdenum and manganese on a ceramic substrate;
    placing the coating substrate in an oven;
    providing a stream of a mixture of nitrogen, hydrogen and oxygen;
    passing the stream through a catalytical reactor to cause the oxygen to catalytically react with the hydrogen to provide a treatment atmosphere comprising nitrogen, hydrogen and water vapor and substantially exempt of oxygen;
    passing said treatment atmosphere to the oven at a selected flow rate;
    permanently monitoring said flow rate to adjust at least the water vapor content in the treatment atmosphere in the oven; and
    raising progressively the temperature in the oven from room temperature to a temperature not exceeding 1600° C.

14. The process according to claim 13 wherein the oxygen is initially present in the nitrogen which is obtained from an in situ adsorption or permeation air separation apparatus.

* * * * *